United States Patent [19]

Arakawa

[11] Patent Number: 4,799,194
[45] Date of Patent: Jan. 17, 1989

[54] SEMICONDUCTOR RANDOM ACCESS NONVOLATILE MEMORY DEVICE WITH RESTORE AND CONTROL CIRCUITS

[75] Inventor: Hideki Arakawa, Yokohama, Japan

[73] Assignee: Fujitsu Limited, Kawasaki, Japan

[21] Appl. No.: 16,729

[22] Filed: Feb. 20, 1987

[30] Foreign Application Priority Data

Feb. 27, 1986 [JP] Japan .................. 61-042383

[51] Int. Cl.⁴ .............. G11C 11/34; G11C 7/00; G11C 11/00
[52] U.S. Cl. .................. 365/154; 265/185; 265/203; 265/190
[58] Field of Search .............. 365/154, 185, 156, 190, 365/189, 226, 228, 184

[56] References Cited

U.S. PATENT DOCUMENTS

| | | | |
|---|---|---|---|
| 3,949,385 | 4/1976 | Sonoda | 365/154 |
| 4,287,574 | 9/1981 | Uchida | 365/156 X |
| 4,300,212 | 11/1981 | Simko | 365/185 |
| 4,400,799 | 8/1983 | Gudger | 365/154 |
| 4,445,203 | 4/1984 | Iwahashi | 365/189 X |
| 4,510,584 | 4/1985 | Dias et al. | 365/203 |
| 4,630,238 | 12/1986 | Arakawa | 365/185 X |
| 4,686,652 | 8/1987 | Spence | 365/154 |
| 4,703,456 | 10/1987 | Arakawa | 365/185 X |
| 4,706,220 | 11/1980 | Spence | 365/154 |

FOREIGN PATENT DOCUMENTS

| | | |
|---|---|---|
| 0086991 A2 | 1/1983 | European Pat. Off. |
| 0121464 A1 | 3/1984 | European Pat. Off. |
| 0147019 A2 | 10/1984 | European Pat. Off. |
| 0152584 A2 | 12/1984 | European Pat. Off. |

OTHER PUBLICATIONS

European Search Report, Appln. No. EP 87301563.0, Vienna, 02-08-1987, Examiner Negwer.

*Primary Examiner*—Stuart N. Hecker
*Assistant Examiner*—Alfonso Garcia
*Attorney, Agent, or Firm*—Staas & Halsey

[57] ABSTRACT

In a nonvolatile memory device which is integrated by combining SRAM cells and nonvolatile memory cells at a ratio of 1:1; a control circuit is provided which, at a recall time, selects all word lines and supplies a predetermined electric potential to bit lines, so that a recall is carried out simply and accurately.

9 Claims, 9 Drawing Sheets

SEMICONDUCTOR RANDOM ACCESS NONVOLATILE MEMORY DEVICE WITH RESTORE AND CONTROL CIRCUITS

BACKGROUND OF THE INVENTION

1. Field of the Invention

The present invention is related to a nonvolatile memory device which is integrated by combining Static RAM (SRAM) cells and nonvolatile memory cells at a 1:1 ratio. In particular, it relates to a circuit for simply and accurately carrying out a recall from the novolatile memory cell to the static RAM cell.

2. Description of the Related Arts

A nonvolatile random access memory known as the nonvolatile RAM (NVRAM) is formed by integrating an Electrical Erasable PROM (EEPROM) and an SRAM on a basis of a ratio of 1:1 in the memory cell unit. In the NVRAM, the information stored in the SRAM can be stored in the EEPROM when the power source is turned off, and the information stored in the EEPROM can be recalled to the SRAM when the power source is turned on.

Conventionally, SRAM cells are formed by a flip-flop having depletion type transistors as loads, and a nonvolatile memory cell is formed by a transistor having a gate in a floating state, for example, a transistor having a floating-gate tunnel oxide (FLOTOX) structure, described later.

In the conventional nonvolatile RAM, as explained in detail hereinafter, the pair of transistors is formed in such a manner that the state of the flip-flop becomes unbalanced. This unbalanced state is formed by the load transistor or by adding capacitors.

However, because the pair of transistors or the pair of capacitors are in an unbalanced state, the relationship between a low level and a high level in flip-flop becomes unsymmetrical and the access speed is reduced. Further, a problem arises in that, as the unbalance between the transistors requires a corresponding unbalance of the cell current, then the an increase of dissipation current occurs. Further, because a depletion type MOS transistor is used as a flip-flop load in the static memory portion, the drawback of an increase in the electric power dissipation arises. Further, the unbalanced state as mentioned above increases the cell area, and the integration density is decreased.

SUMMARY OF THE INVENTION

An object of the present invention is to provide a semiconductor nonvolatile memory device which can operate symmetrically.

Another object of the present invention is to provide a semiconductor nonvolatile memory device which can be operated with a low electric power dissipation.

A further object of the present invention is to provide a semiconductor nonvolatile memory device having reduced dimensions.

A still further object of the present invention is to solve the problem wherein, when the SRAM cell is formed by CMOS inverters to decrease the power dissipation of the NVRAM, it is difficult to reset the balance state of 0V, 0V of nodes of the flip-flops at the time of a recall.

According to the present invention, the semiconductor nonvolatile memory device comprises a pair of bit lines; a plurality of memory cells, each including a static memory cell connected between the pair of bit lines and a nonvolatile memory cell connected to the static memory cell; a plurality of word lines connected to the memory cells; and a control circuit, operatively connected to the word lines and at least one of the bit lines, for supplying a predetermined potential to the bit line to make the static memory cell a predetermined state and selecting all of the word lines when information stored in the nonvolatile memory cell is recalled to the static memory cell.

Further features and advantages of the present invention will be apparent from the ensuing desorption with reference to the accompanying drawings to which, however, the scope of the invention is in no way limited.

DESCRIPTION OF THE PREFERRED EMBODIMENTS

Figure 1A:
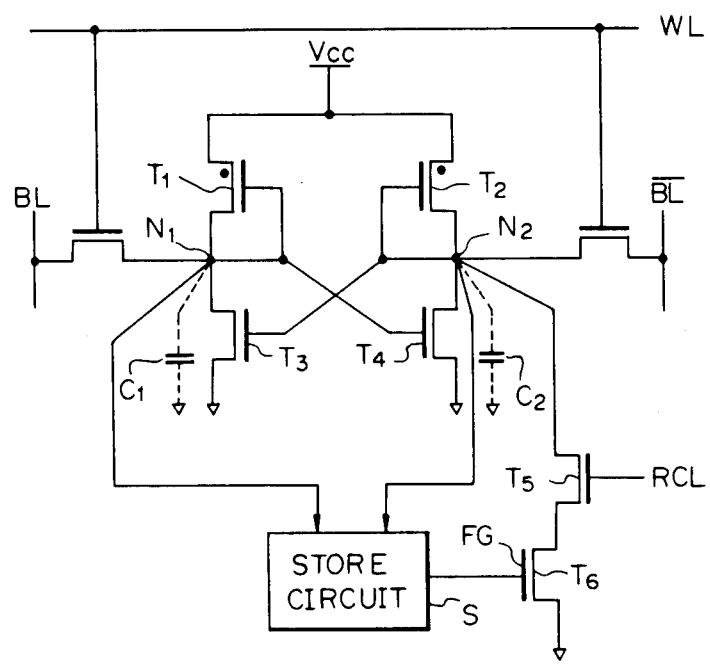
FIGS. 1A and 1B show a conventional circuit diagram and waveforms for explaining one example of the conventional circuit, respectively.
Figure 2A:
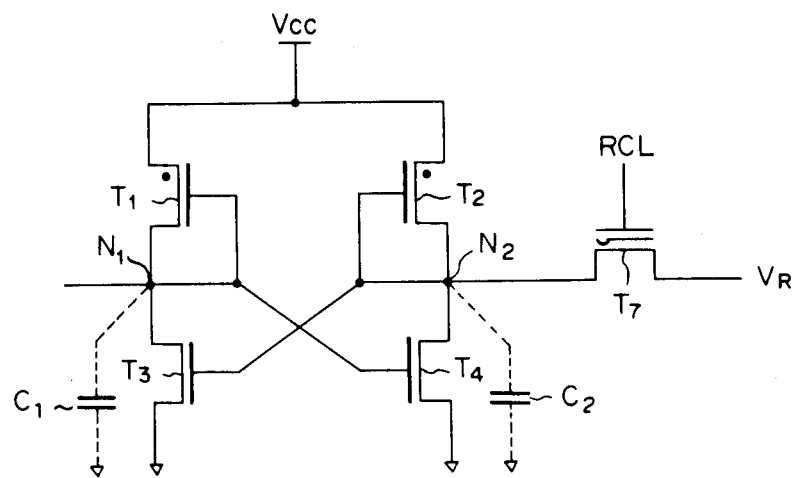
FIGS. 2A and 2B show another conventional circuit diagram and waveforms for explaining another example of the conventional circuit, respectively.

FIG. 1A and FIG. 2A are circuit diagrams of one example of a conventional NVRAM.

Figure 1B:
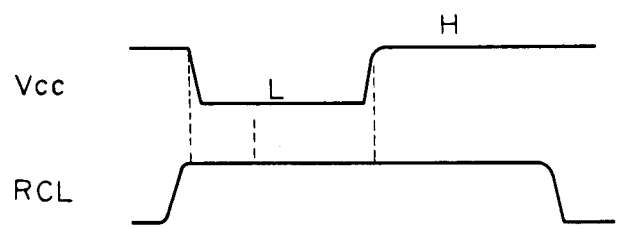
Figure 2B:
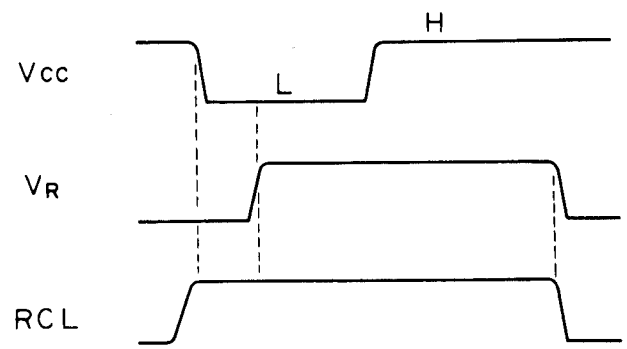

FIG. 1B and FIG. 2B are timing charts respectively showing an electric power source $V_{CC}$ at a recall time, a recall signal RCL, and a control signal.

The circuit shown in FIG. 1A is described in detail in Japanese Patent Application No. 58-191039 (which correspond to Japanese Unexamined Patent Publication No. 60-83374 and U.S. Pat. No. 4,630,238), and the circuit shown in FIG. 1B is described in detail in Japanese Patent Application No. 58-45697.

In FIG. 1A and FIG. 1B, depletion transistors $T_1$, $T_2$ and N channel enhancement transistors $T_3$, $T_4$ form a SRAM cell. Further, a nonvolatile memory cell is formed, as shown in FIG. 1A, by a transistor $T_6$ in which a gate FG is in a floating state, and, as shown in FIG. 2A, by a transistor having a FLOTOX construction.

Data is written in to the nonvolatile memory cell by injecting electrons into the floating gates of the transistors $T_6$, $T_7$, or releasing of electrons from those floating gates. Therefore, the threshold voltage at the transistors $T_6$, $T_7$ changes and $T_6$, $T_7$ are placed in an ON or OFF state in accordance with the data in the SRAM. On the other hand, the recall operation is carried out as follows. Namely, in FIG. 1A, and as shown in FIG. 1B, the power source $V_{CC}$ rises when the recall transistor $T_5$ is ON. At this time, if the transistor $T_6$ is ON, because a node $N_2$ is at a low level, only an electric potential of $N_1$ rises, and thus $T_4$ becomes ON and $T_3$ becomes OFF, so that $N_1$ becomes high level and $N_2$ becomes low level. On the other hand, if $T_6$ is OFF state, since $N_2$ is in a floating state, the state of flip-flop formed by $T_1$–$T_4$ is not unique. Then, when $T_6$ is OFF, the state of the flip-flop must be determined to be in the opposite state of that when $T_6$ is ON state. Therefore, the circuit is conventionally formed in such a manner that the flip-flop is unbalanced. This unbalanced state is determined by load transistors $T_1$, $T_2$, or capacitors $C_1$, $C_2$. For example, the unbalance of the load transistors $T_1$, $T_2$ is determined by the relationship W/L, where W is the channel width and L is the channel length, and the unbalance of the value of the capacitances $C_1$, $C_2$ is determined by the shape of the pattern. For example, if the values of the capacitance have the relationship $C_1 > C_2$, the recall operation when $T_6$ is OFF is carried out as follows. Namely, when the power source voltage $V_{CC}$ rises, if the relationship of the capacitors is $C_1 > C_2$, the electric potential at the node $N_1$ rises more slowly than that of the node $N_2$, and thus the node $N_1$ becomes low level and the node $N_2$ becomes high level. On the other hand, as $N_2$ is forcibly made a low level when $T_6$ is ON, as already mentioned, the node $N_1$ 215 becomes high level, and the node $N_2$ becomes low level. The relationship between the channel wdth W and the channel length L of the depletion type load transistors $T_1$, $T_2$ is as follows. That is, usually a current becomes larger when W is larger, and the current becomes larger when L is smaller, and accordingly, the value of W/L is equivalent to the value of the resistors. Therefore, the recall operation as mentioned above can be carried out due to the load, i.e., the relationship W/L, instead of the value of $C_1$, $C_2$. In the case shown in FIG. 2A, VR rises during the recall operation, and therefore, the relationship between $T_7$ in an ON or OFF state and the levels of $N_1$, $N_2$ becomes the reverse of those shown in FIG. 1A. The other foundamental operation is the same as that shown in FIG. 1A. That is, when $T_7$ is ON, $N_2$ becomes high level and $N_1$ becomes low level, and when $T_7$ is OFF, $N_2$ becomes low level and $N_1$ becomes high level. However, the relationship of the values of capacitance is $C_1 > C_2$ In the construction of the NVRAM as mentioned above, ideally the capacitances $C_1$, $C_2$ are naturally determined by the pattern obtained when a layout of the integrated circuit is designed. However, in practice, the capacitance $C_1$ generated at the node $N_1$ depends on the transistors $T_1$, $T_3$ and the capacitance $C_2$ generated at the node $N_2$ depends on the transistors $T_2$, $T_4$, $T_5$, $T_6$, etc., and therefore, to satisfy the condition $C_1 > C_2$, the capacitance $C_1$ must be made intentionally large, which causes a corresponding increase in the cell area. On the other hand, to differentiate the load transistors $T_1$, $T_2$, for example, $T_1 > T_2$, the dimensions of the channel width or the channel length must be different, and thus the cell area is again increased. Further, because $T_1$ and $T_2$ or $C_1$ and $C_2$ are made in an unbalanced state, as the SRAM characteristic, the relationship between the low level in the node $N_1$ and low level at the node $N_2$ or high level in the node $N_2$ (level itself and charging speed) becomes nonsymmetrical, and thus the problem of a reduced access speed arises. Further, a problem arises in that, as the unbalance between $T_1$ and $T_2$ requires a corresponding unbalance in the cell current, and this causes an increase in dissipation current. Further, because a depletion type MOS transistor is used as a flip-flop load in the static memory portion, a drawback of an increased electric power dissipation occurs.

Accordingly, an attempt is made to lower the electric power by using a CMOS circuit. However, in this case, if the nodes $N_1$, $N_2$ of the flip-flop are intended to be 0 volt, by making the electric power source 0 volts, these are only decreased to the threshold value $V_{th}$ of the p-channel (P-ch) enhancement transistor, i.e., about −1V, and this 1 volt voltage remains. Therefore, the nodes $N_1$, $N_2$ of the flip-flop stop at, for example, 0 V, 1 V, and do not reach the balanced state of 0 V, 0 V. Therefore, if the flip-flop can not be completely reset, there is a danger that the recall operation will malfunction.

Figure 3A:
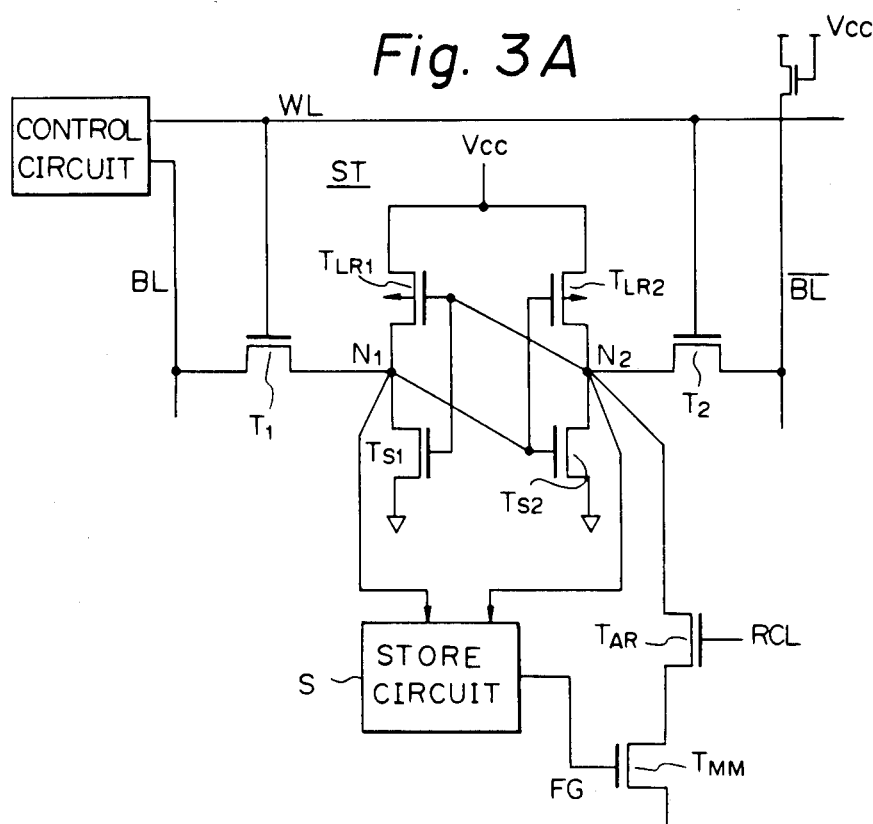
FIGS. 3A an 3B show a circuit diagram of an essential portion of the circuit of first embodiment of the present invention and waveforms thereof, respectively.

FIG. 3A is a circuit diagram showing an essential portion of one embodiment of the present invention. In FIG. 3A, ST is a static RAM, $T_{MM}$ is a transistor of an EEPROM cell, BL is a bit line, WL is a word line, $V_{CC}$ is a high power source, and $V_{SS}$ is a low power source(in this case, ground). N channel enhancement transistors forming a flip-flop of the static RAM cell are designated as $T_{S1}$, $T_{S2}$, $T_{LR1}$, $T_{LR2}$, an enhancement type p-ch load transistor at a node $N_2$ side of the flip-flop transistor of SRAM connected to the recall transistor $T_{AR}$ is $T_{LR2}$, and an enhancement type p-ch transistor of the other load is $T_{LR1}$. These transistors are connected to corresponding n-channel enhancement transistors $T_{S1}$, $T_{S2}$ to form a complementary type MOS inverter, and the pair of inverters are cross-connected to form a flip-flop circuit. A recall control signal RCL is applied to a gate of the recall transistor $T_{AR}$ S is a store circuit, but as the present invention is concerned with the recall operation, the construction thereof is the same as the prior art, and it is not necessary to make a special explanation thereof.

In the above-mentioned construction, the operation (store) for storing the data from a static RAM side to an EEPROM side is exactly the same as that of the prior art. On the other hand, the operation for recalling the data from the static RAM side to the EEPROM side is as explained below.

① The bit line (BL) voltage VBL is made 0 V (VBL =0 V) and the bit line ($\overline{BL}$) voltage $V_{\overline{BL}}$ is made $V_{CC}$ ($V_{\overline{BL}}=V_{CC}$) The word line WL voltage $V_{WL}$ rises to turn $T_1$ and $T_2$ on. ($V_{WL}=V_{CC}$) As a result, the node $N_1$ voltage $V_{N1}$ is reset to 0V ($V_{N1}=0V$) and the node $N_1$ voltage $VN_2$ is reset to $V_{CC}(V_{N2}=V_{CC})$. ② When the recall signal RCL is at a high level ($V_{ARC}=V_{CC}$), $V_{N1}$ and $V_{N2}$ change in accordance with whether the transistor $T_{MM}$, which forms the EEPROM cell, is ON or OFF.

Figure 3B:
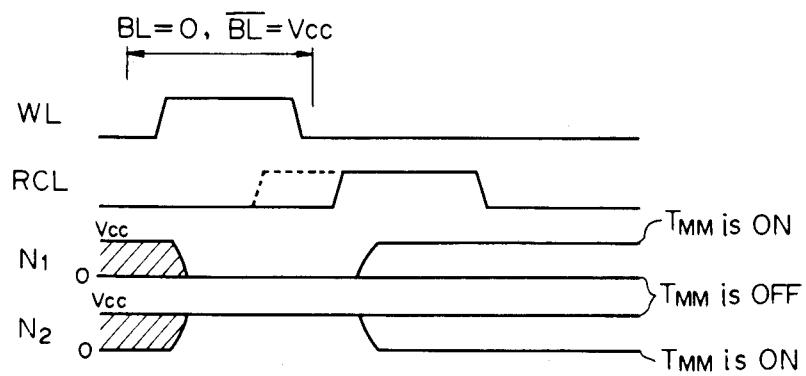

That is, as shown in FIG. 3A, (a) When the transistor $T_{MM}$ is ON→$VN_1 = V_{CC}$ and $N_2 = 0V$, (b) When the transistor $T_{MM}$ is OFF →$V_{N1}=0$ V and $V_{N1} = V_{CC}$ FIG. 3B shows waveforms in the circuit of this embodiment of the present invention.

In the Figure, hatched portions show that the potential of $N_1$ or $N_2$ is unstable whether it is high level or low level, and further, RCL may be applied before the word line voltage $V_{WL}$ falls as shown by the dotted line.

As clear from FIG. 3B, when the transistor $T_{MM}$ is ON, as in item (a) mentioned above (it is assumed that information "1" exists), a plus charge is injected to the floating gate FG of the transistor $T_{MM}$, and thus the $T_{MM}$ is turned ON. When the signal. RCL becomes H level at the time of the recall operating, and the recall transistor $T_{AR}$ becomes ON, the node $N_2$ is connected via $T_{AR}$ and $T_{MM}$ to the ground (GND).

Therefore, when the nodes $N_1$ and $N_2$ of the SRAM are high level and low level, respectively, the SRAM is reset to the original state by the recall operation. On the other hand when the nodes $N_1$ and, $N_2$ of the SRAM are low level and high level, respectively, the current flows from the node $N_2$ to the ground, the state of the flip-flop is inverted, and $N_1$ and $N_2$ become high level and low level, respectively. Namely, the "1" of the EEPROM cell is recalled to the SRAM cell by the recall operation.

Further, when the transistor $T_{MM}$ is OFF, as in item (b) above (it is assumed that information "0" is held), a minus charge is injected to the floating gate FG of the transistor $T_{MM}$, the $T_{MM}$ becomes OFF, and even if the recall transistor $T_{AR}$ becomes ON, the node $N_2$ is disconnected from the ground GND. Therefore, even if the signal RCL becomes high level at the time of the recall and $T_{AR}$ becomes ON, the SRAM cell is held in the original state, that is, $V_{N1}=0V$ and $N_2=V_{CC}$. Namely, the "0" of the EEPROM cell is recalled to the SRAM cell by the recall operation.

However, to assure the operation of the embodiment mentioned above, it is necessary to maintain the ratio between the load transistor $T_{LR2}$ of the flip-flop and ($T_{AR}+T_{MM}$). Unless the ratio of the current value which can flow in $T_{AR}+T_{MM}$ to that which can flow in $T_{LR2}$ is sufficient, and the data in the node $N_2$ is rapidly taken out to remove the electric level in the node $N_2$, the p-ch load transistor may be turned ON and thus the flip-flop is inversely set.

Usually, the following condition should be satisfied.

$$\frac{(W/L) \text{ of } T_{LR2}}{((W/L) \text{ of } T_{AR}) + ((W/L) \text{ of } T_{MM})} \leq 1 \text{ preferably } \leq \frac{1}{2} \quad (1)$$

In the above equation, W denotes a channel width and L denotes a channel length of each transistor.

Here, since $T_{LR2}$ is a p-ch enhancement transistor, the mobility of the carriers is lower than that of an n-ch enhancement transistor, and thus the ratio may be comparatively small, as shown in the equation (1).

Figure 4:
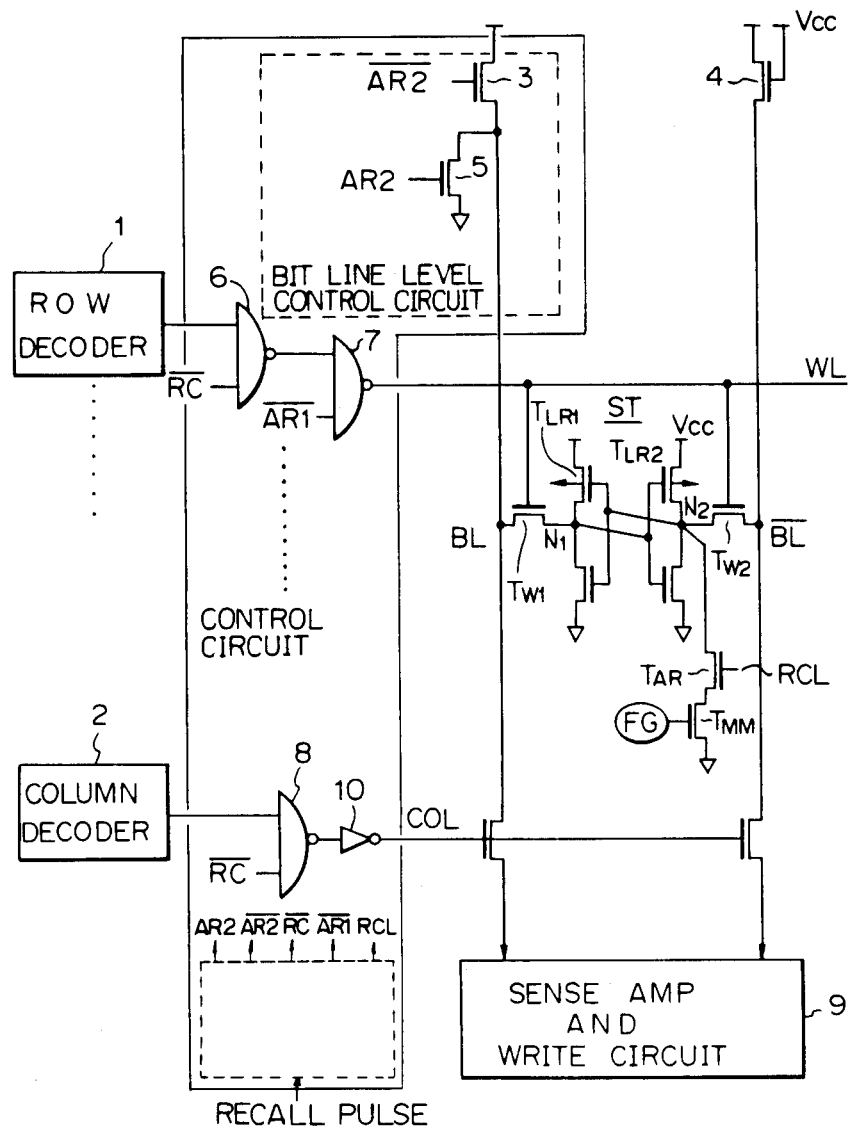
FIG. 4 is a circuit diagram showing the construction for a reset operation at a recall time in first the embodiment of the present invention.

Next, the circuit construction for carrying out the reset in the recall operation mentioned in item ① of the above embodiment will be explained with reference to FIG. 4. In FIG. 4, 1 designates a row decoder (ROW), 2 designates a column decoder (Column), 3 and 4 designate bit line load transistors, 5 designates a bit line level control transistor, 6, 7, and 8 designate NAND gates, and 9 designates a sense amplifier and write circuit. Further (the bar denotes a active low signal as shown hereinafter) $\overline{AR2}$, RC, and $\overline{RC}$ are control signals. Elements the same as shown in FIG. 3A are denoted by the same symbols. Further, in FIG. 4, a plurality of SRAM cells (ST) are connected between bit lines BL and $\overline{BL}$, also a plurality of word lines WL are connected to SRAM cells and gates 6, 7 are provided in the same number as the word lines respectively, however, these are not shown.

Figure 5:
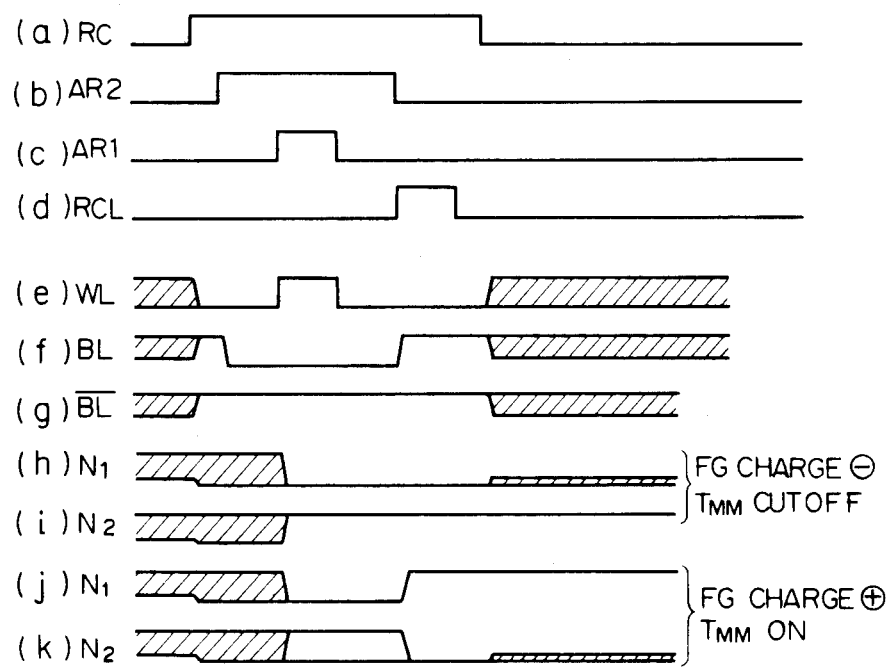
FIGS. 5 $(a)$–$(k)$ shows waveforms for explaining the operation of the embodiment of the present invention.

FIG. 5 is a diagram showing waveforms of the operation of the circuit shown in FIG. 4. The circuit of FIG. 4 will be explained with reference to FIG. 5. First, a recall mode signal RC is made to rise at a recall time as shown in (a) of FIG. 5. Accordingly, the output of the gate 8 becomes high level, and a low level is output via the inverter 10 to the output gate COL. The COL is then cut off so that the sense amplifier and write circuit 9 and a bit line are separated. Next, the signal AR2 is made to rise as shown in (b) of FIG. 5, the bit line load transistor 3 is turned OFF and the transistor 5 is turned ON, so that the bit line BL is connected via the transistor 5 to ground, that is, to 0V. On the other hand, BL is made to rise via the bit line load transistor 4 to a high potential of power source $V_{CC}$. Next, when the signal AR1 has risen as shown in (c) of FIG. 5, the output of gate 7 becomes high level, all word lines WL are at a selected level (high level), and the transistors $T_{W1}$ and $T_{W2}$ of the word transfer gate become ON, so that the nodes $N_1$, $N_2$ of the flip-flops of the SRAM cell ST are reset to 0V, $V_{CC}$ respectively, in accordance with 0V, $V_{CC}$ of BL, $\overline{BL}$. In this state, the recall control signal RCL is made low level, all word lines WL become low level, and the word transfer gates $T_{W1}$ and $T_{W2}$ are turned OFF, so that the flip-flops of the SRAM cell ST are separated from the bit lines. In this state, when the recall control signal RCL becomes H level, the recall transistor $T_{AR}$ is turned ON, the $T_{MM}$ is made ON when information 1 is stored in the EEPROM (the plus charges are stored in the floating gate FG), and the node $N_2$ is then grounded. Therefore, when the nodes $N_1$ and $N_2$ of the SRAM cell are high level and high level, respectively, these nodes $N_1$ and $N_2$ are reset to the original state by the recall operation, and when the nodes $N_1$ and $N_2$ of the SRAM are low level and high level respectively, the flip-flops are inverted so that the nodes $N_1$ and $N_2$ become high level and low level respectively, as shown in (j) and (k) of FIG. 5.

Further, when the EEPROM cell maintains information at "0" (floating gate FG has a minus charge), the $T_{MM}$ is turned OFF, and thus even if the recall transistor $T_{AR}$ is turned ON, the node $N_2$ is separated from $V_{SS}$. Therefore, the state of the SRAM cell is set as it is, and accordingly, the electric potentials of the nodes $N_1$ and $N_2$ are $V_{N1}=0V$ and $V_{N1}=V_{CC}$ as shown in (h) and (i) of FIG. 5.

Figure 6A:
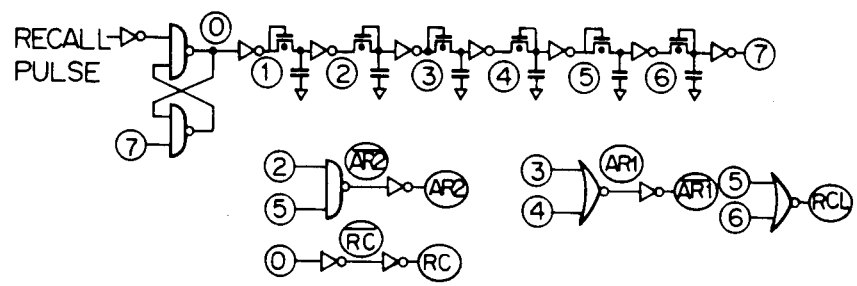
FIGS. 6A and 6B $(a)$–$(m)$ for generating a timing necessary for first the embodiment of the present invention, and timing waveforms thereof, respectively.
Figure 6B:
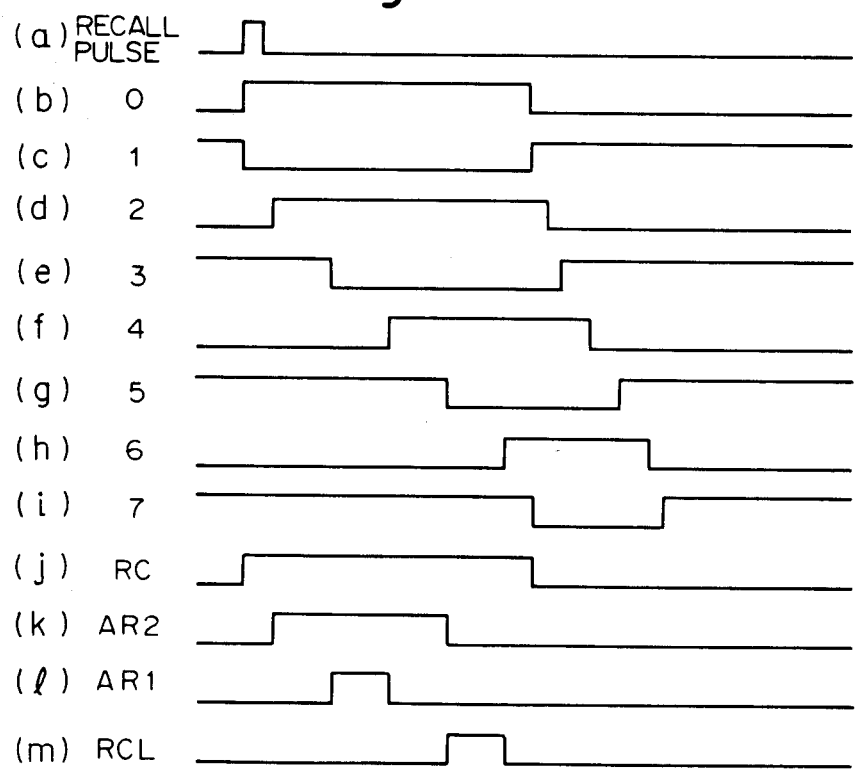

FIG. 6A shows a circuit construction for generating the timing signal required for the recall operation of the embodiment of the present invention, and FIG. 6B shows waveforms for the operation thereof. The circuit shown in FIG. 6A is provided with flip-flops at the input thereof and timing generating circuits (which are formed by an inverter, a depletion type MOS transistor formed as a diode and a capacitor and which are actuated as a delay circuit) for generating a timing signal from ① to ⑦. The recall pulse shown in (a) of FIG. 6B is applied to the input of the flip-flop, and the output ⑦ of the timing generating circuit at the last stage is fed back to the flip-flop to reset the same. In FIG. 6B, (b) to (i) are waveforms at each point ⓪ − ⑦ in FIG. 6A. A signal AR2 is obtained as an inverted signal of the output of the NAND gate by inputting the output signals ② ⑤ and of the timing generating circuit as shown in (k) of FIG. 6B, a signal AR1 is obtained as the output of NOR gate by inputting ③ and ④ as shown in (l) of FIG. 6B, a signal RCL is obtained as the output of the NOR gate by inputting ⑤ and ⑥ as shown in (m) of FIG. 6B, and a signal RC is obtained from the output ⓪ of the flip-flop, as shown in (j) of FIG. 6B.

Figure 7A:
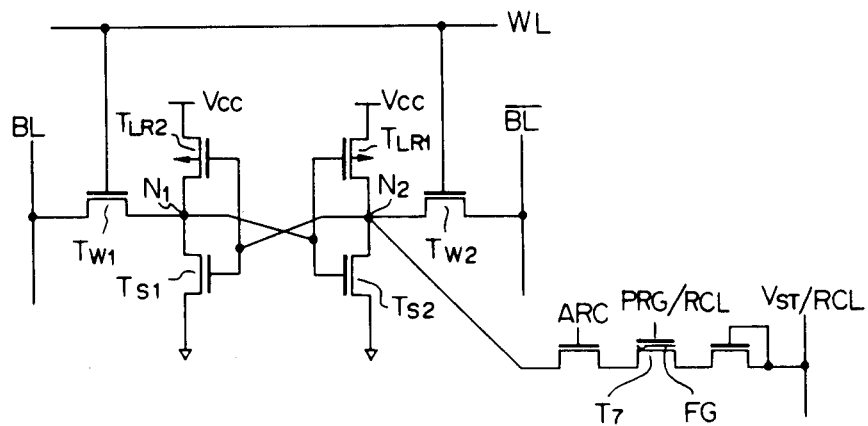
FIGS. 7A and 7B show a circuit diagram of an essential portion of the circuit of a second embodiment of the present invention and waveforms thereof, respectively.
Figure 7B:
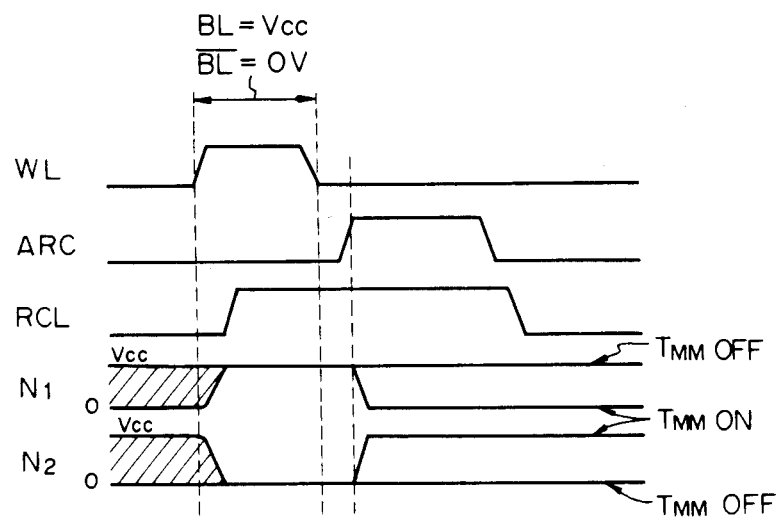

FIG. 7A is a circuit diagram showing another embodiment of the NVRAM according to the present invention. Elements the same as those shown in FIG. 3A are designated by the same symbols. FIG. 7B shows waveforms for explaining the operation of the circuit shown in FIG. 7A.

In the construction of FIG. 3A, at the recall time, the current is allowed to flow to the ground (GND), but in the case of FIG. 7A, the current is made to flow from an external source at the recall time. In this case, at the recall time, the voltage $V_{ST}$/RCL is supplied from the external source to cause a current flow, and at the store time, two voltages such as 0V and 22V are used. A nonvolatile transistor $T_7$ has a construction in which the transistor $T_{MM}$ and a part of the store circuit S, as shown in FIG. 3A, are formed as one body, and this corresponds to $T_7$ in FIG. 2A. At the recall time, the control gate is made high level by PRG/RCL, and becomes ON and OFF in accordance with the plus or minus of the charge in the floating gate. In this case, when the nonvolatile memory transistor $T_7$ has information "1", contrary to the first embodiment, minus charges are stored in the floating gate so that $T_7$ is made OFF, and when $T_7$ has information "0", plus charges are stored in the floating gate so that $T_7$ is made ON. Therefore, if at the reset time of the flip-flop, the node $N_1$ is reset to the H level and the node $N_2$ is reset to 0 volt, contrary to the case of FIG. 3A (all word lines are selected as in the above mentioned embodiment and BL is supplied by high level and $\overline{BL}$ is supplied by low level, contrary to the first embodiment), and at the recall time, $V_{ST}$/RCL is made $V_{CC}$ so that the current is made to flow to the node of the flip-flop when $T_7$ is ON, and the information in the EEPROM cell can be restored in the SRAM cell.

Figure 8A:
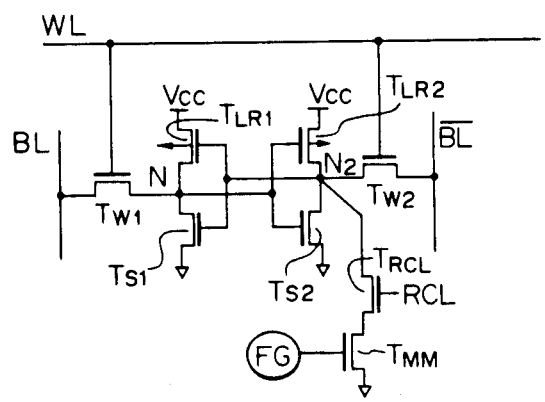
FIGS. 8A and 8B show a circuit diagram of an essential portion of the circuit of a third embodiment of the present invention and waveforms thereof; and, FIGS. 9A and 9B show a circuit diagram of an essential portion of the circuit of a fourth embodiment of the present invention and waveforms thereof.
Figure 8B:
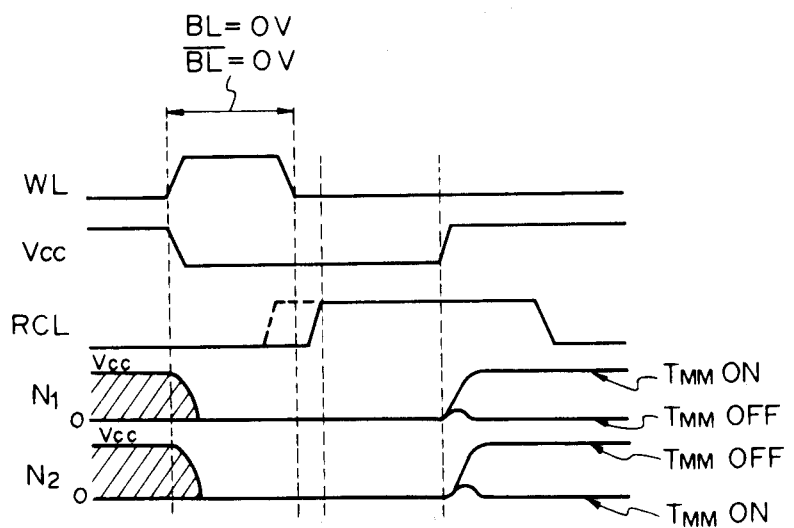

A further embodiment of the invention is shown in FIG. 8A. FIG. 8B shows waveforms for explaining the operation of the circuit shown in FIG. 8A. The symbols in each Figure denote the same elements as those of FIG. 3A. In this embodiment, the construction by which all word lines are selected at the recall time, and a predetermined electric potential is supplied to the bit lines to reset the flip-flop, is common for each embodiment as already mentioned. However, in this embodiment, by resetting the SRAM cell at the recall time, both nodes $N_1$ and $N_2$ of the flip-flop are made 0V. To this end, in this embodiment, all word lines WL are selected during the time the flip-flop of the SRAM cell is reset during the recall mode, i.e., a 0V reset voltage is supplied from bit lines BL, $\overline{BL}$ to the flip-flop. Hereinafter, the recall operation is carried out in the conventional manner. For example, when the flip-flop has an unbalanced construction as in the prior art, and the electric potential of the node $N_2$ is made to rise earlier than that of the node $N_1$ at a rise time of the power source, the transistor TRCL of the transfer gate is turned ON by the recall mode signal RC, the flip-flop is set in accordance with whether the transistor $T_{MM}$ of EEPROM is ON or OFF, and therefore, the information can be restored.

Figure 9A:
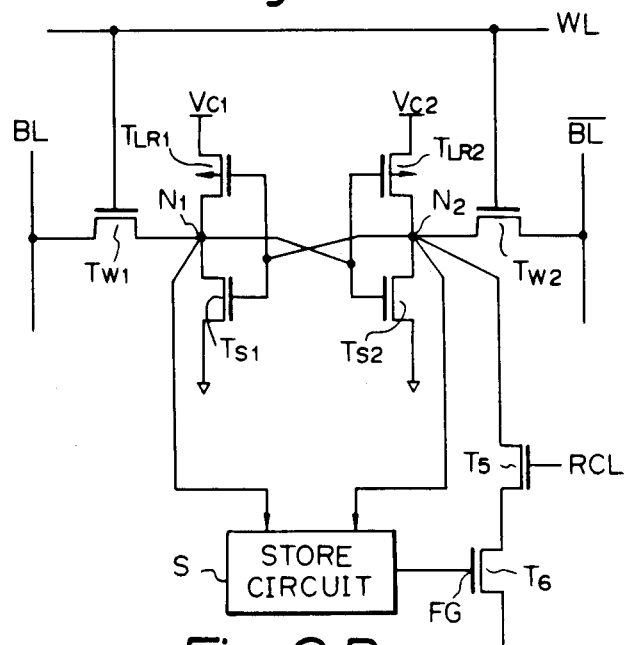
Figure 9B:
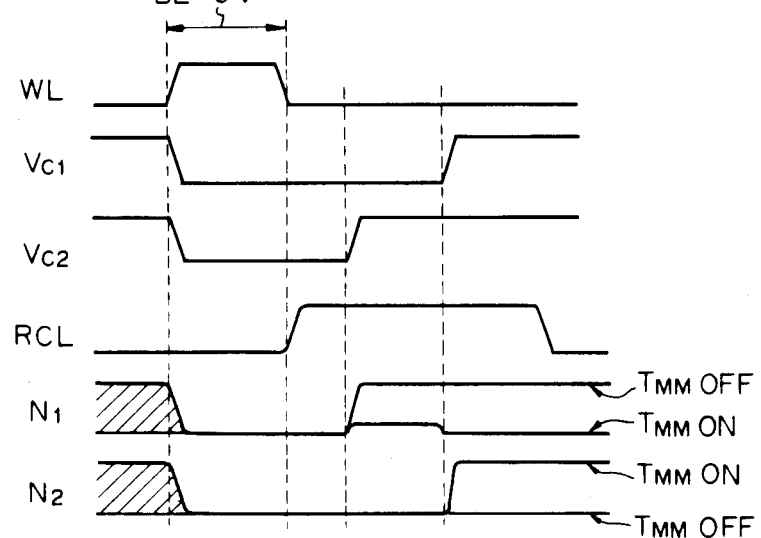

Or, instead of the forming the flip-flop with an unbalanced construction as shown in FIG. 8A, as in the circuit construction shown in FIG. 9A as another embodiment, an unbalanced operation may be introduced to the operation of the flip-flop by shifting the timing for applying the source voltage VC1 and VC2 of the flip-flop. That is, when the transistor $T_6$ in the EEPROM cell is turned On, the timing for applying the power sources VC1 and VC2 for the p-ch transistors $T_{LR1}$ and $T_{LR2}$ of the flip-flop may be shifted so that the flip-flop is set in a reverse state when the transistors of the EEPROM cell are ON.

Further, the embodiments of FIGS. 8A and 9A show the case in which the current flows to the ground at the recall time, however, it will be clear that the construction by which the current may be allowed to flow from an external source at the recall time (corresponding to FIG. 7A) is also possible.

According to the present invention, the SRAM cell of the NVRAM has a CMOS construction, so that the power dissipation can be considerably decreased compared to when a depletion type load transistor is used as in the prior art, and any malfunction of the recall operation can be avoided. Further, the construction thereof is comparatively simple, compared with the prior art, and the recall operation is always available.

I claim:

1. A semiconductor nonvolatile memory device comprising:
   a pair of bit lines;
   a plurality of word lines;
   decoder means, coupled to said plurality of word lines, for selecting one of said word lines;
   first and second transfer gate transistors having gates connected to one of said word lines;
   a plurality of memory cells, each of said memory cells including:
   a static memory cell including a flip-flop having first and second terminals connected between said pair of bit lines by way of said first and second transfer gate transistors; and
   a nonvolatile memory cell connected to said first and second terminals of said flip-flop; and
   a control circuit, operatively connected to said word lines, one of said bit lines and said decoder means, for selecting all of said word lines, turning on said first and second transfer gate transistors in said memory cells when information stored in said nonvolatile memory cell is recalled to said static memory cell, and supplying a predetermined potential to said flip-flop through said bit lines, said first and second transfer gate transistors making said flip-flop a predetermined state.

2. A semiconductor nonvolatile memory device according to claim 1, wherein said flip-flop includes cross-coupled complementary type inverters said first transfer gate transistor connected between one of said bit lines and said first terminal, and said second transfer gate transistor connected between the other one of said bit lines and said second terminal, and
   wherein said nonvolatile memory cell includes a nonvolatile memory transistor, and said semiconductor nonvolatile memory device further comprises:
   a third transfer gate transistor connected between said nonvolatile memory transistor and one of said first and second terminals.

3. A semiconductor nonvolatile memory device according to claim 2, wherein said complementary type inverters include a load transistor connected to said third transfer gate transistor, and a relationship between said load transistor and said nonvolatile memory transistor is as shown by the following equation:

$$\frac{(W/L) \text{ of the load transistor}}{(W/L) \text{ of (the third transistor gate +}} \leq 1$$
$$(W/L) \text{ of the nonvolatile memory transistsor)}$$

wherein W denotes a channel width and L denotes a channel length.

4. A semiconductor nonvolatile memory device according to claim 2, wherein said third transfer gate transistor is turned on after said static memory cell reaches the predetermined state.

5. A semiconductor nonvolatile memory device, comprising:
a pair of bit lines;
a plurality of word lines;
decoder means, coupled to said plurality of word lines, for selecting one of said word lines;
first and second transfer gate transistor having gates connected to one of said word lines;
a plurality of memory cells, each of said memory cells including:
a static memory cell including a flip-flop having first and second terminals connected between said pair of bit lines by way of said first and second transfer gate transistors; and
a nonvolatile memory cell connected to said flip-flop;
a control circuit, operatively connected to said word lines, said bit lines, and said decoder means, for selecting all of said word lines, turning on said first and second transfer gate transistors in said memory cells when information stored in said nonvolatile memory cell is recalled to said static memory cell, and supplying a predetermined potential to said flip-flop through said bit lines, said first and second transfer gate transistors making said flip-flop a predetermined state, said control circuit including a bit line level control circuit, connected to one of said bit lines, for supplying a predetermined potential to one of said bit lines in response to a first control signal;
a row decoder, connected to said word lines, for selecting one of said word lines;
an output gate circuit connected to said bit lines;
a column decoder, connected to said output gate circuit, for controlling said output gate circuit;
a first gate circuit, connected between said row decoder and said word lines, for inhibiting an output of said row decoder in response to a second control signal and outputting a selection signal to all of said word lines in response to a third control signal;
a second gate circuit, connected between said column decoder and said output gate circuit, for inhibiting transfer of an output of said column decoder and turning said output gate circuit off in response to the second control signal; and
a timing generator circuit, connected to said first and second gate circuits and said bit line level control circuit, for generating the first, second and third control signals.

6. A semiconductor nonvolatile memory device according to claim 5, wherein said first gate circuit comprises:
a first NAND circuit having a first input connected to said row decoder and a second input for receiving the second control signal; and
a second NAND circuit having a first input connected to an output of said first NAND circuit, a second input for receiving the third control signal and an output connected to said word line, and wherein said second gate circuit comprises:
a third NAND circuit having a first input connected to said column decoder and a second input for receiving said second control signal; and
inverters connected between said third NAND circuit and said output gate.

7. A semiconductor nonvolatile memory device according to claim 5, wherein said bit line level control circuit comprises:
a first transistor, connected between said bit line and a high power source, for separating said bit line from the high power source when the first control signal is applied; and
a second transistor, connected to said bit line, for supplying the predetermined potential when the first control signal is applied.

8. A semiconductor nonvolatile memory device according to claim 5, wherein said timing generator circuit comprises:
a flip-flop circuit connected to an input terminal;
first through seventh delay circuits connected in series, each delay circuit including:
an inverter;
a depletion type MOS transistor connected as a diode to said inverter; and
a capacitor connected between an output of said depletion type MOS transistor and a low power source, each of said first through seventh delay circuits having a first through seventh output, respectively, the first control signal being obtained as a reverse output of said NAND circuit which inputs the second and the fifth output signals of said delay circuits, the third control signal being obtained from the output of a first NOR gate which inputs third and fourth outputs of said timing generator circuit, the second control signal being obtained from the output of said flip-flop circuit, and a recall control signal for controlling the third transfer gate transistor being obtained from a second NOR gate which inputs the fifth and sixth outputs of said delay circuits.

9. A semiconductor nonvolatile memory device according to claim 5, wherein the first control signal is generated while the second control signal is generated, and the third control signal is generated while the first control signal is generated.

* * * * *

UNITED STATES PATENT AND TRADEMARK OFFICE
CERTIFICATE OF CORRECTION

PATENT NO. : 4,799,194
DATED : JANUARY 17, 1989
INVENTOR(S) : HIDEKI ARAKAWA

It is certified that error appears in the above-identified patent and that said Letters Patent is hereby corrected as shown below:

Col. 3, line 31, delete "215";

line 57, "T4" should be --$T_4$--;

line 65, "made" should be --placed--.

Col. 4, line 5, delete "and";

line 37, "$T_{AR}$" should be -- $T_{AR}.$--;

line 48, "VBL" should be --$V_{BL}$--;

line 49, "(VBL" should be --($V_{BL}$--; and "$V_{BL}$" should be --$\overline{V_{BL}}$--;

line 51, "$V_{cc}$)" should be --$V_{cc}$).--;

line 53, "$VN_2$" should be --$V_{N2}$--;

line 59, "$VN_1$" should be --$V_{N1}$--;

line 60, "$N_2$" should be --$V_{N2}$--;

line 62, "$V_{N1}$" should be --$V_{N2}$--.

UNITED STATES PATENT AND TRADEMARK OFFICE
CERTIFICATE OF CORRECTION

PATENT NO. : 4,799,194

DATED : JANUARY 17, 1989

INVENTOR(S) : HIDEKI ARAKAWA

It is certified that error appears in the above-identified patent and that said Letters Patent is hereby corrected as shown below:

Col. 5, line 27, "$N_2$" should be --$V_{N2}$--;

line 35, "taken out" should be --output--;

line 58, after "Further" insert --, $\overline{ARI}$--.

Col. 6, line 62, " ② ⑤ " should be --② and ⑤--;

line 62, delete "and";

line 64, after "of" insert --the--.

Signed and Sealed this

Thirtieth Day of May, 1989

Attest:

DONALD J. QUIGG

*Attesting Officer*  *Commissioner of Patents and Trademarks*